US009088266B2

(12) United States Patent
Lee

(10) Patent No.: US 9,088,266 B2
(45) Date of Patent: Jul. 21, 2015

(54) IMPEDANCE MATCHING DEVICE, LINEAR MOTION MODULE, AND RADIO FREQUENCY POWER SUPPLY DEVICE

(71) Applicant: Plasmart Inc., Daejeon (KR)

(72) Inventor: Wonoh Lee, Daejeon (KR)

(73) Assignee: PLASMART INC., Daejeon (KR)

( * ) Notice: Subject to any disclaimer, the term of this patent is extended or adjusted under 35 U.S.C. 154(b) by 0 days.

(21) Appl. No.: 14/101,854

(22) Filed: Dec. 10, 2013

(65) Prior Publication Data

US 2014/0097912 A1 Apr. 10, 2014

Related U.S. Application Data

(63) Continuation of application No. PCT/KR2012/005107, filed on Jun. 28, 2012.

(30) Foreign Application Priority Data

Jul. 1, 2011 (KR) .......................... 10-2011-0065347

(51) Int. Cl.
*H03H 7/38* (2006.01)
*H05H 1/46* (2006.01)
*H03H 7/40* (2006.01)
*H01G 5/40* (2006.01)

(52) U.S. Cl.
CPC . *H03H 7/38* (2013.01); *H05H 1/46* (2013.01); *H01G 5/40* (2013.01); *H03H 7/40* (2013.01); *H05H 2001/4682* (2013.01)

(58) Field of Classification Search
CPC ............. H03H 7/38; H03H 7/40; H05H 1/46; H05H 2001/4682; H01G 5/40

USPC ...................................... 333/32, 33, 263, 17.3
See application file for complete search history.

(56) References Cited

U.S. PATENT DOCUMENTS

| | | | | |
|---|---|---|---|---|
| 3,899,699 A | * | 8/1975 | Griffing | ......................... 310/13 |
| 4,210,865 A | * | 7/1980 | Nikolaev et al. | ......... 324/207.17 |
| 2011/0063042 A1 | * | 3/2011 | Mendolia et al. | ............ 333/17.3 |

FOREIGN PATENT DOCUMENTS

| | | |
|---|---|---|
| JP | 05-198390 | 8/1993 |
| KR | 10-2005-0056830 | 6/2005 |
| KR | 10-2008-0029790 | 4/2008 |
| KR | 10-2008-0094155 | 10/2008 |
| WO | WO 2013/005943 | 1/2013 |

OTHER PUBLICATIONS

Machine translation of JP 05-198390, translated Jun. 19, 2014.*
International Search Report for PCT/KR2012/005107 dated Nov. 23, 2012.

* cited by examiner

*Primary Examiner* — Stephen E Jones
*Assistant Examiner* — Scott S Outten
(74) *Attorney, Agent, or Firm* — Jenkins, Wilson, Taylor & Hunt, P.A.

(57) ABSTRACT

An impedance matching device includes a first variable capacitor connected to an RF power source and including a first shaft moving linearly, a first linear motion unit axially coupled to the first shaft of the first variable capacitor to provide linear motion, a first insulating joint connecting the first shaft to a first driving shaft of the first linear motion unit, and a first displacement sensor adapted to measure a movement distance of the first driving shaft of the first linear motion unit.

10 Claims, 9 Drawing Sheets

US 9,088,266 B2

IMPEDANCE MATCHING DEVICE, LINEAR MOTION MODULE, AND RADIO FREQUENCY POWER SUPPLY DEVICE

CROSS-REFERENCE TO RELATED APPLICATIONS

This application is a continuation of and claims priority to PCT/KR2012/005107 filed on Jun. 28, 2012, which claims priority to Korea Patent Application No. 10-2011-0065347 filed on Jul. 1, 2011, the entirety of which is hereby incorporated by reference.

BACKGROUND OF THE INVENTION

1. Field of the Invention

The present invention described herein generally relates to impedance matching devices and, more particularly, to an impedance matching device that includes a linear motion unit and directly drives a variable capacitor.

2. Description of the Related Art

An impedance matching device employing a variable capacitor is low in response speed due to the use of rotational motion.

SUMMARY OF THE INVENTION

Embodiments of the present invention provide an impedance matching device with high-speed response.

An impedance matching device according to an exemplary embodiment of the present invention may include a first variable capacitor connected to an RF power source and including a first shaft moving linearly; a first linear motion unit axially coupled to the first shaft of the first variable capacitor to provide linear motion; a first insulating joint connecting the first shaft to a first driving shaft of the first linear motion unit; and a first displacement sensor adapted to measure a movement distance of the first driving shaft of the first linear motion unit.

In an exemplary embodiment, the impedance matching device may further include a second variable capacitor including a second shaft moving linearly; a second linear motion unit axially coupled to the second shaft of the second variable capacitor to provide linear motion; a second insulating joint connecting the second shaft to a second driving shaft of the second linear motion unit; and a second displacement sensor adapted to measure a movement distance of the second driving shaft of the second linear motion unit.

In an exemplary embodiment, the first linear motion unit may include a coil bobbin coupled to the other end of the first driving shaft; and a first permanent magnet unit disposed to encircle the first driving shaft and provide linear motion to the coil bobbin.

In an exemplary embodiment, the impedance matching device may further include a front-end flange coupled to a first electrode of the first variable capacitor; a back-end flange coupled to the first linear motion unit; and an insulating fixing part disposed to encircle the first insulating joint and having one end coupled to the front-end flange and the other end coupled to the back-end flange.

In an exemplary embodiment, the impedance matching device may further include a motion control unit adapted to control the first linear motion unit; a power detection unit adapted to detect a reflected wave reflected in a direction of the RF power source; and a control unit adapted to control the motion control unit by receiving an output signal of the power detection unit and an output signal of the first displacement sensor.

In an exemplary embodiment, the first displacement sensor may include a displacement sensor mount extending from the first driving shaft of the first linear motion unit; an encoder scaler mounted on the displacement sensor mount; and an encoder readout unit spaced apart from the encoder scaler.

In an exemplary embodiment, a frequency of the RF power source is variable.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present invention.

DETAILED DESCRIPTION OF EMBODIMENTS

Figure 1:
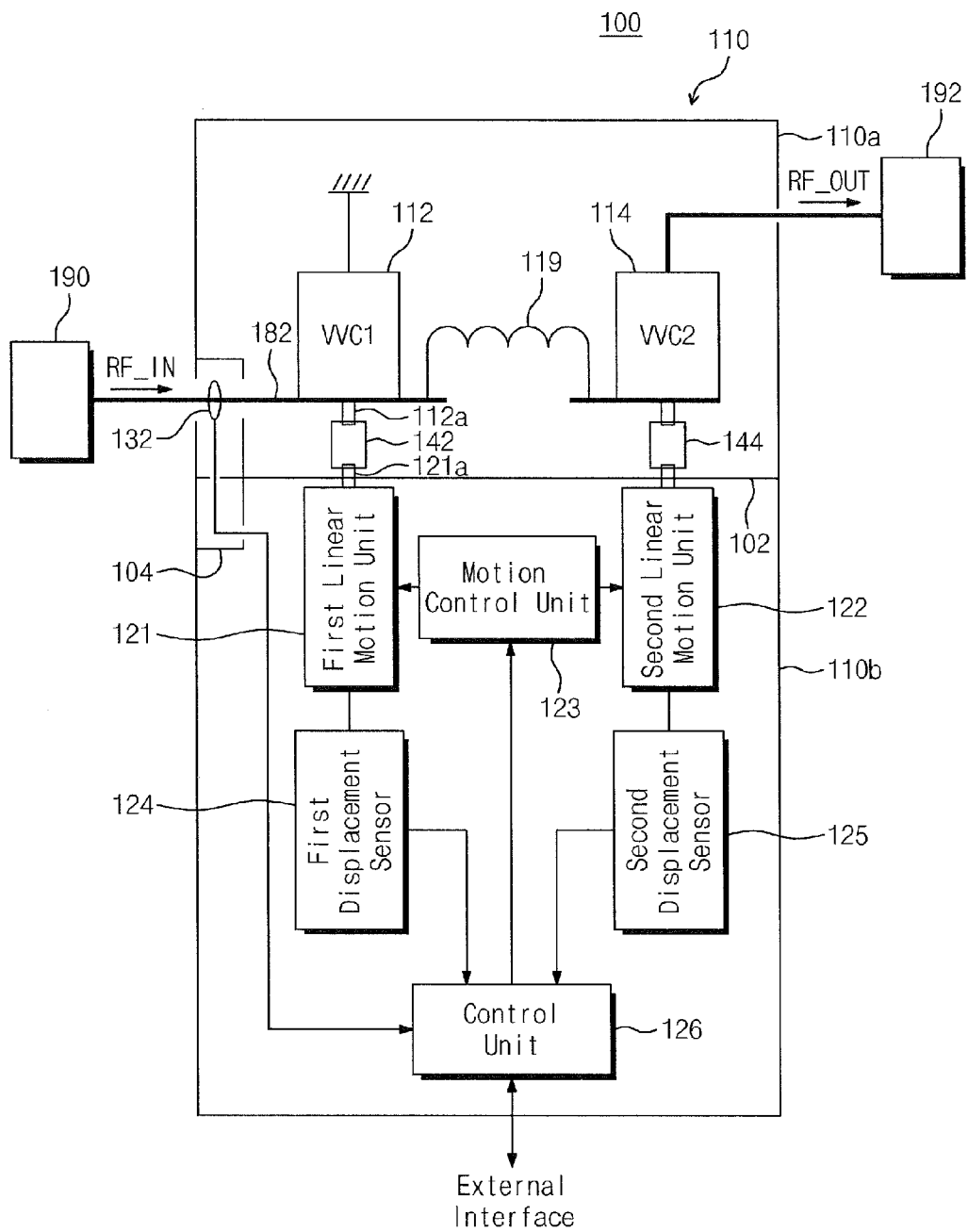
FIG. 1 illustrates an impedance matching device according to an embodiment of the present invention.

When RF plasma is generated in a semiconductor process or the like, it is necessary to perform matching in the early time. Accordingly, impedance matching has been performed by changing a frequency without use of a variable passive element. However, a frequency-variable impedance matching device must be connected to an RF power source to perform impedance matching. The frequency-variable impedance matching device may have high response speed. However, since the frequency-variable impedance matching device uses a frequency as a parameter, it is difficult for the frequency-variable impedance matching device to minimize a reflected wave in an impedance matching device that requires two degrees of freedom. Moreover, when a load significantly varies depending on time, it is difficult for the frequency-variable impedance matching device to perform impedance matching.

Conventionally, capacity of a variable capacitor is moved by converting a rotational motion into a linear motion. Long-term use of an expensive apparatus results in a wear problem caused by friction that occurs when a rotational motion is converted into a linear motion, rather than a structural defect of a variable capacitor itself. Accordingly, when a lubricant is used to eliminate the wear problem, other problems such as lubricant contamination and lubricant vaporization occur. Moreover, a driving unit using a rotational motion requires high manufacturing cost and space to achieve high speed.

An impedance matching device according to an embodiment of the present invention directly provides a linear motion to a variable capacitor. Since a friction movement distance of a linear motion unit providing the linear motion is relatively short, the lifetime of the linear motion unit may be extended and a connection structure of the linear motion unit may be simplified. In addition, the linear motion unit may perform high-speed matching.

In case of an electronic impedance matching device employing a conventional capacitor switching scheme, a size of a matching network increases as allowable current and voltage increases. Moreover, the degree of allowable current and voltage is limited.

However, an impedance matching device according to an embodiment of the present invention uses a linear motion unit that allows a linear motion to be performed in a narrow space. Moreover, the impedance matching device uses a variable capacitor to reduce limitation in current and voltage of the variable capacitor. Thus, space saving in a clean room obtains a gain in term of cost.

An impedance matching device according to an embodiment of the present invention includes a linear motion driving unit to drive a variable reactance passive element. The linear motion driving unit has high response speed. Thus, the impedance matching device matches impedance with a wide-range load.

A plasma process of a few seconds or less or a plasma process treated with a process having time-dependent parameters has been used in semiconductor manufacturing. For this reason, the plasma process must be stabilized within hundreds of milliseconds (msec) or tens of milliseconds (msec). Accordingly, there is a need for an impedance matching device that is capable of performing high-speed impedance matching.

Exemplary embodiments of the present invention will now be described more fully with reference to the accompanying drawings, in which exemplary embodiments of the present invention are shown. Exemplary embodiments of the present invention may, however, be embodied in many different forms and should not be construed as limited to the embodiments set forth herein. Rather, these exemplary embodiments of the present invention are provided so that this description will be thorough and complete, and will fully convey the concept of exemplary embodiments of the present invention to those of ordinary skill in the art. In the drawings, the sizes and relative sizes of elements may be exaggerated for clarity. Like numerals refer to like elements throughout.

FIG. 1 illustrates an impedance matching device according to an embodiment of the present invention.

Figure 2:
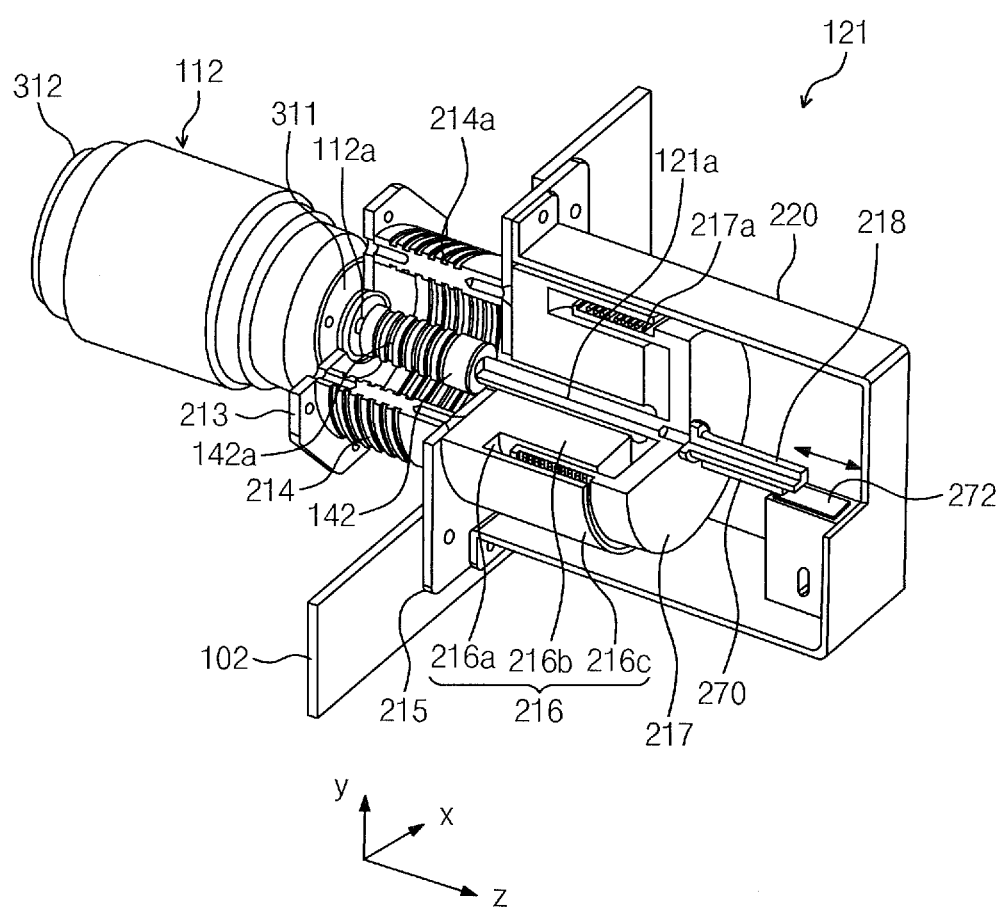
FIG. 2 illustrates a first linear motion unit in FIG. 1.

FIG. 2 illustrates a first linear motion unit in FIG. 1.

Figure 3:
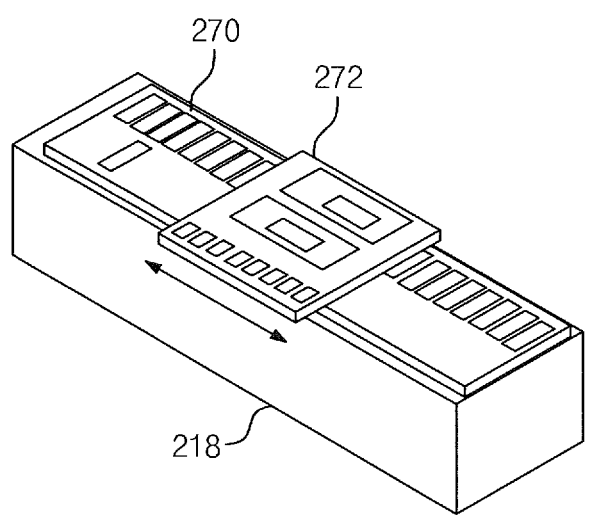
FIG. 3 illustrates a displacement sensor.
Figure 4:
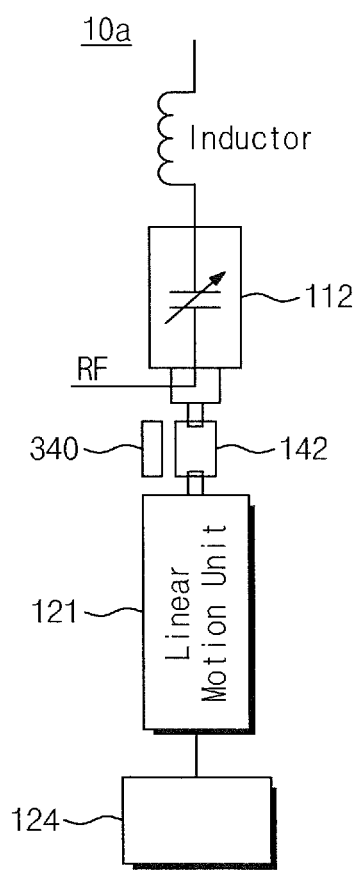
FIGS. 4 to 9 illustrate a linear motion module according to an embodiment of the present invention.
Figure 5:
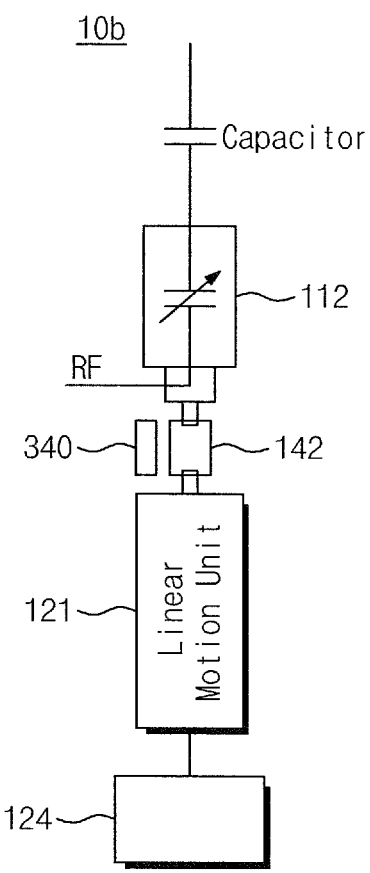
Figure 6:
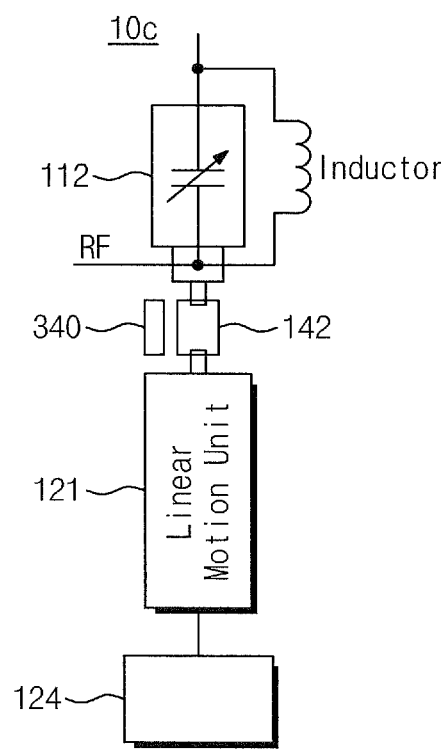
Figure 7:
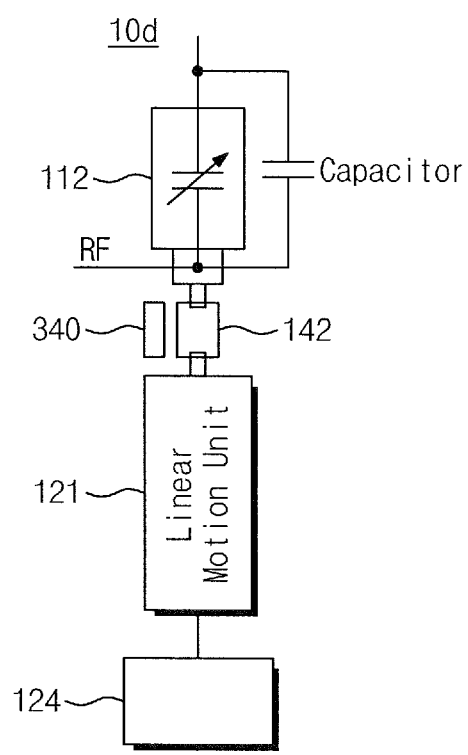

FIG. 3 illustrates a displacement sensor.

Referring to FIGS. 1 to 3, an impedance matching device 100 includes a first variable capacitor 112 connected to an RF power source 190 and including a first shaft 112a moving linearly, a first linear motion unit axially coupled to the first shaft 112a of the first variable capacitor 112 to provide linear motion, a first insulating joint 142 connecting the first shaft 112a to a first driving shaft of the first linear motion unit 121, and a first displacement sensor 124 adapted to measure a movement distance of the first driving shaft 121a of the first linear motion unit 121.

The impedance matching device 100 may include an outer cover 110. The outer cover 110 may be divided into an RF region 110a and a system region 110b by a divider 102. The divider 102 may be formed of a conductor plate. The outer cover 110 may be formed of a conductive material.

In the RF region 110a, the first variable capacitor 112 and/or the second variable capacitor 114 may be disposed. A first electrode 311 of the first variable capacitor 112 may be connected to an output of the RF power source 190 and one end of a first inductor 119, and a second electrode 312 of the first variable capacitor 112 may be grounded.

A first electrode of the second variable capacitor 114 may be connected to the other end of the first inductor 119. A second electrode of the second variable capacitor 114 may be connected to a load 192.

A power detector 132 may be disposed in the vicinity of an input line 182 connecting the output of the RF power source 190 to the first electrode 311 of the first variable capacitor 112. A shield layer 104 may be disposed in the vicinity of the power detector 132. The shield layer 104 may shield an external electromagnetic wave.

A frequency of the RF power source 190 may be between 400 kilohertz (kHz) and several hundreds of megahertz (MHz). The frequency of the RF power source 190 is variable.

The load 192 may be energy apply means for generating plasma. For example, the load 192 may include an electrode to generate capacitively coupled plasma or an antenna to generate inductively coupled plasma. Impedance of the load 192 may vary depending on time. The impedance of the load 192 may be dependent on a pressure of process gas to generate plasma or a process by-product that is produced as a process is performed.

Each of the first and second variable capacitors 112 and 114 may be a variable vacuum capacitor. The vacuum variable capacitor may allow a high voltage and much current to flow. The variable capacitor includes a first electrode and a second electrode, and capacitance may vary depending on a distance between the first electrode and the second electrode or the cross-coupled or inserted degree of the first electrode and the second electrode.

The first linear motion unit 121 may include a first driving shaft 121a, a coil bobbin 217, and a permanent magnet unit 216. The first linear driving unit 121 may be a voice coil motor. The first linear motion unit 121 may have high-speed response characteristics. A maximum movement distance of the first linear motion unit 121 may be around 20 millimeters (mm). The maximum movement distance may be obtained for 0.5 second or less.

One end of the first driving shaft 121a is axially coupled to the first insulating joint 142. The other end of the driving shaft 121a is coupled to the coil bobbin 217.

One end of the coil bobbin 217 may have an open cylinder shape. The coil may include an induction coil. The coil bobbin 217 may include a disc-shaped plate and a cylindrical cylinder coupled to the disc-shaped plate. The induction coil 217a is wound on an external side surface of the coil bobbin 217. The induction coil 217a may be connected to a motion control unit 123.

The permanent magnet unit 216 encircles the first driving shaft 121a and provides a linear motion to the coil bobbin 217. The permanent magnet unit 216 may has a circular groove 216a which is formed in the vicinity of the permanent magnet unit 216 such that the coil bobbin 217 is inserted into the circular groove 216a. The circular groove 216a may perform a guide function for the coil bobbin 217. Depth of the circular groove 216a may be greater than the maximum movement length of the first shaft 112a of the variable capacitor.

The permanent magnet unit 216 includes a permanent magnet 216b and a magnetic induction housing 216c encircling the permanent magnet 216b. The circular groove may be a space between the permanent magnet 216b and the magnetic induction housing 216c.

The center of one surface of a circular plate of the coil bobbin 217 may be connected to the first driving shaft 121a, and the center of the other surface of the circular plate may be connected to a displacement sensor mount 218.

The first insulating joint 142 may be a plastic, resin or Teflon material. The first insulating joint 142 may be formed of an insulating material. The first insulating joint 142 may have a cylindrical shape. One end of the first insulating joint 142 may be axially coupled to the first shaft 112a, and the other end of the first insulating joint 142 may be axially coupled to the first driving shaft 121a. The first insulating joint 142 may have a plurality of ring-shaped grooves 142 which is formed on its surface such that a current transmission distance increases to enhance the insulation effect.

If the first variable capacitor is a vacuum capacitor, the first shaft may be pulled in the first variable capacitor by a difference between vacuum pressure and atmospheric pressure. Especially, when a power source is not supplied to the linear motion unit, a linear motion stop unit (not shown) may be disposed in the vicinity of the first insulating joint 142 to prevent the first insulating joint 142 from being released by vacuum. The linear motion stop unit may prevent component damage caused by an impact that occurs when the first insulating joint 142 is released by vacuum. The linear motion stop unit may be a spring, a damper or a breaker.

A front-end flange 213 may be coupled to the first electrode 311 of the first variable capacitor 112. The front-end flange 213 may be closely coupled to the first electrode 311 and may be formed of a conductive material. The front-end flange 213 may be electrically connected to the RF power source 190. The front-end flange 213 may be coupled to the first electrode 213 by a screw.

A back-end flange 215 may be coupled to the first linear motion driving unit 121. The back-end flange 215 may be coupled to the permanent magnet unit 216. The back-end flange 215 may be fixed to the divider 102.

An insulating fixing part 214 may encircle the first insulating joint 142 and have one end coupled to the front-end flange 213 and the other end coupled to the back-end flange 215. The insulating fixing part 214 may be formed of an insulating material. The insulating fixing part 214 may be cylindrical. The insulating fixing part 214 may have a plurality of ring-shaped grooves 214a on its surface to be flexible.

As the coil bobbin 217 moves in its central axis direction or in the z-axis direction, the first shaft 112 may moves in the z-axis direction. Thus, the capacitance of the first variable capacitor 112 varies. The coil bobbin 217 may move through the maximum movement distance within 0.5 second or less.

A displacement sensor may be mounted to detect a movement distance of the coil bobbin 217. A first displacement sensor 124 may include a displacement sensor mount 218 extending from the first driving shaft 121a of the first linear motion unit 121, an encoder scaler 270 mounted on the displacement sensor mount 218, and an encoder readout unit 272 spaced apart from the encoder scaler 270. The displacement sensor may have a resolution of 1000 count or more with respect to the maximum movement distance.

The displacement sensor mount 218 may be screw-coupled to the coil bobbin 217. The displacement sensor mount 218 may have a square cylindrical shape. The encoder scaler 270 may be disposed on one surface of the displacement sensor mount 218.

The encoder readout unit 272 may be disposed to face the encoder scaler 270 and to be spaced apart from the encoder scaler 270. The encoder readout unit 272 may measure a reciprocal distance from the encoder scaler 270 while moving along the encoder scaler 270. An output signal of the encoder readout unit 272 is provided to a control unit 126.

The motion control unit 123 drives the first linear motion unit 121 and/or the second linear motion unit 122.

A power detection unit 132 may detect power reflected at an input terminal of an impedance matching device from the RF power source 190. The power detection unit 132 may be a directional coupler or a current/voltage sensor. The power detection unit 132 may detect a signal associated with a reflected wave.

The power detection unit 132 may be disposed at an output terminal of the impedance matching device or may also be disposed inside the impedance matching device.

By detecting an output signal of the power detection unit 132, the control unit 126 may control capacitances of the first variable capacitor 112 and the second variable capacitor 114 such that the impedance matching device transfers maximum power to the load 192. The capacitance of the first variable capacitor 112 may be controlled by the first linear motion unit 121, and the capacitance of the second variable capacitor 114 may be controlled by the second linear motion unit 122. The control unit 126 may communicate with an external device. For example, the control unit 126 may communicate with the RF power source 190 and/or a computer.

An algorithm where the control unit 126 controls the capacitances of the first variable capacitor 112 and the variable capacitor 114 may employ a conventional method. For example, the algorithm is disclosed in Korean Patent Publication No. 10-2008-0094155. In addition, an impedance matching scheme of the impedance matching device may be one of L-type, inverted L-type, T-type, and $\pi$-type.

The second linear motion unit 122 may have the same structure as the first linear motion unit 121.

The second insulating joint 144 may have the same structure as the first insulating joint 142.

A second displacement sensor 125 may have the same structure as a first displacement sensor 124. The first displacement sensor 124 may employ a potentiometer method, an optical method, a magnetic method, an electronic induction method, a linear encoder method, an eddy current method, an ultrasonic method or the like.

According to a modified embodiment of the present invention, the impedance matching device may be used in double-frequency matching having a plurality of frequencies.

According to a modified embodiment of the present invention, the impedance matching device may be used in hybrid impedance matching using an RF power source having a variable frequency and a separate variable capacitor.

FIGS. 4 to 9 illustrate a linear motion module according to an embodiment of the present invention.

In order to avoid duplicate explanations, the following explanations relate only to aspects that are different from FIGS. 1 to 3.

Referring to FIGS. 4 to 7, linear motion modules 10a-10d, respectively, each includes a first linear motion unit 121 axially coupled to a first shaft of a first variable capacitor 112 connected to an RF power source and including the first shaft moving linearly, a first insulating joint 142 connecting the first shaft to a first driving shaft of the first linear motion unit 121 to provide linear motion, and a first displacement sensor 124 adapted to measure a movement distance of the first driving shaft of the first linear motion unit 121. A linear motion stop unit 340 is disposed in the vicinity of the first insulating joint 142 to prevent the first shaft from being pulled by a difference between vacuum pressure and atmospheric pressure. A capacitor or an inductor may be connected in series or parallel to the first variable capacitor 112.

Figure 8:
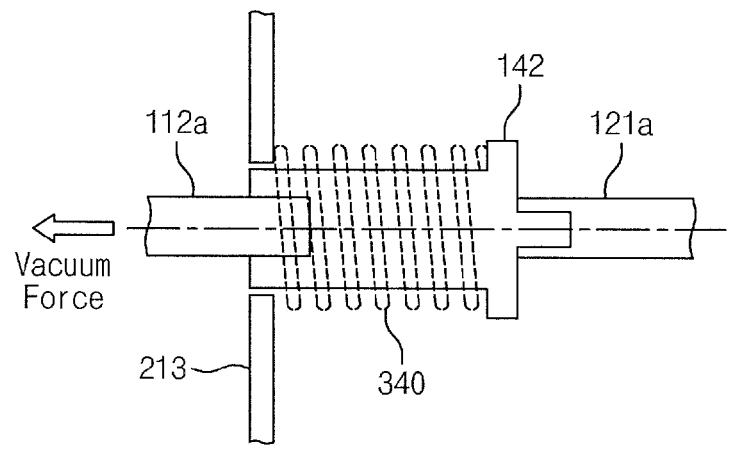

Referring to FIG. 8, the linear motion stop unit 340 may be a spring. The first linear motion stop unit 340 may be a spring disposed to encircle the first insulating joint 142. One end of the first insulating joint 142 connected to a linear motion driving unit may have a projection. The projection of the insulating joint 142 may function as a breaker to prevent the insulating joint 142 from being pulled by a vacuum force.

The spring is disposed between the projection and a front-end flange 213. The spring may allow a vacuum force applied in an axis direction of the first variable capacitor 112 to be offset by a repulsive force and may provide a force required for the linear motion unit 121.

Figure 9:
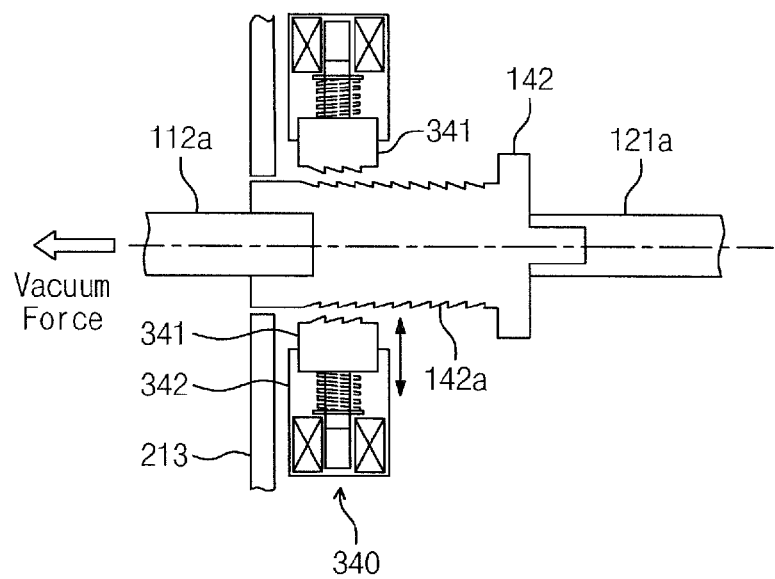

Referring to FIG. 9, the linear motion stop unit 340 includes a protrusion 341 inserted into a groove 142a formed on an external circumferential surface of the first insulating joint 142 and a driver 342 coupled to the protrusion 341 to move the protrusion 341. The protrusion 341 may have a saw-toothed shape. One end of the first insulating joint 142 connected to a linear motion driving unit may have a projection.

Figure 10:
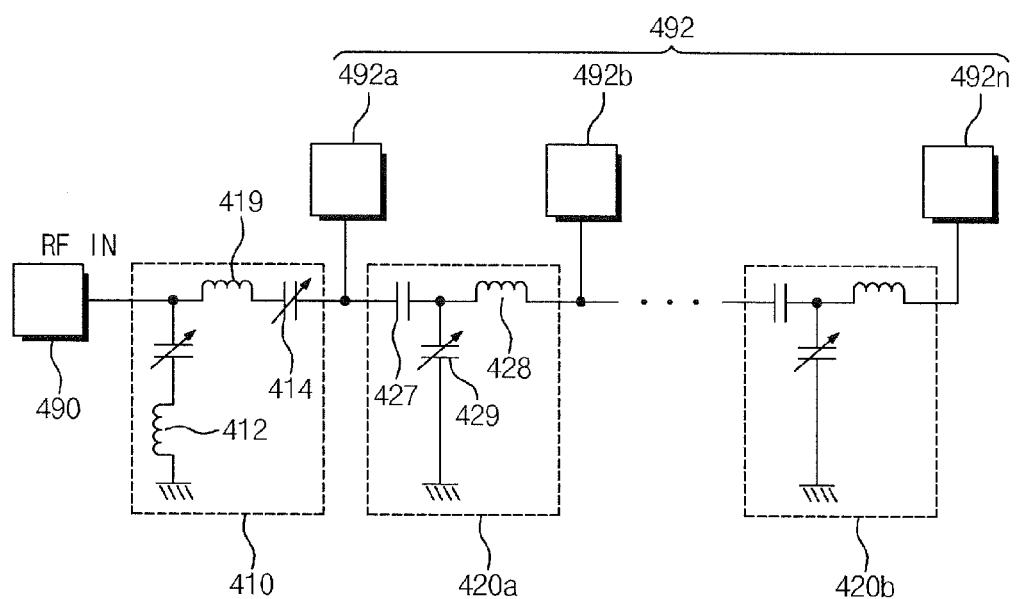
FIG. 10 is a circuit diagram of a radio-frequency power supply device according to an embodiment of the present invention.

FIG. 10 is a circuit diagram of a radio-frequency power supply device according to an embodiment of the present invention.

In order to avoid duplicate explanations, the following explanations relate only to aspects that are different from FIGS. 1 to 9.

Referring to FIG. 10, a radio frequency (RF) power supply device includes a single RF power source (RF) 490 and an impedance matching unit 410 disposed between the RF power source 490 and at least one load 492.

The impedance matching unit 410 includes a first variable capacitor 412 including a first shaft moving linearly, a first linear motion unit (not shown) axially coupled to the first shaft of the first variable capacitor 412 to provide linear motion, a first insulating joint (not shown) connecting the first shaft to a first driving shaft of the first linear motion unit, and a first displacement sensor (not shown) adapted to measure a movement distance of the first driving shaft of the first linear motion unit.

The impedance matching unit 410 is disposed between a first load 492a and the RF power source 490. The impedance matching unit 410 may include a first variable capacitor 412, a second variable capacitor 414, and an inductor 419. One end of the first variable capacitor 412 may be connected to an output terminal of the RF power source 490, and the other end of the first variable capacitor 412 may be grounded. One end of the inductor 419 is connected to the output terminal of the RF power source 490, and the other end of the inductor 419 may be connected to one end of the second variable capacitor 414. One end of the second variable capacitor 414 is connected to the other end of the inductor 419, and the other end of the second variable capacitor 414 is connected to the first load 492a.

The load 492 includes the first load 492a and the second load 492b. A power distribution unit 420a is disposed between the first load 492a and the second load 492b. The first load 492a may be an outside antenna for generating inductively coupled plasma, and the second load 492b may be an inner antenna disposed inside the outside antenna. Alternatively, the load 492 may be an electrode for generating capacitively coupled plasma.

The power distribution unit 420a may include a capacitor 427 and an inductor 428 serially coupled between the first load 492a and the second 492b and a variable capacitor 429 having one end that is coupled between the capacitor 427 and the inductor 428 and the other end that is grounded. The power distribution unit 420a may distribution power between the first load 492a and the second load 492b at a constant rate. The variable capacitor 429 may be driven by a linear motion unit in the same manner as the first and second variable capacitor 412 and 414 of the impedance matching unit 410.

The load 492 may be modified to include two or more loads 492a, 492b, and 492n. Accordingly, power distribution units 420a and 420b may be additionally disposed between the loads 492a, 492b, and 492n.

As described so far, an impedance matching device according to an embodiment of the present invention can provide high-speed matching.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the present invention.

What is claimed is:

1. An impedance matching device comprising:
   a first variable capacitor connected to an RF power source and including a first shaft moving linearly;
   a first linear motion unit axially coupled to the first shaft of the first variable capacitor to provide linear motion;
   a first insulating joint connecting the first shaft to a first driving shaft of the first linear motion unit;
   a first displacement sensor adapted to measure a movement distance of the first driving shaft of the first linear motion unit,
   a motion control unit adapted to control the first linear motion unit;
   a power detection unit adapted to detect a reflected wave reflected in a direction of the RF power source; and
   a control unit adapted to control the motion control unit by receiving an output signal of the power detection unit and an output signal of the first displacement sensor.

2. The impedance matching device of claim 1, wherein the first displacement sensor comprises:
   a displacement sensor mount extending from the first driving shaft of the first linear motion unit;
   an encoder scaler mounted on the displacement sensor mount; and
   an encoder readout unit spaced apart from the encoder scaler.

3. The impedance matching device of claim 1, wherein a frequency of the RF power source is variable.

4. The impedance matching device of claim 1, further comprising:
   a fixed reactive element connected in series or parallel to the first variable capacitor.

5. An impedance matching device comprising:
   a first variable capacitor connected to an RF power source and including a first shaft moving linearly;
   a first linear motion unit axially coupled to the first shaft of the first variable capacitor to provide linear motion;
   a first insulating joint connecting the first shaft to a first driving shaft of the first linear motion unit;
   a first displacement sensor adapted to measure a movement distance of the first driving shaft of the first linear motion unit; and
   a linear motion stop unit disposed in the vicinity of the first insulating joint to prevent the first shaft from being pulled by a difference between vacuum pressure and atmospheric pressure.

6. A linear motion module comprising:
   a first linear motion unit axially coupled to a first shaft of a first variable capacitor connected to an RF power source and including the first shaft moving linearly;
   a first insulating joint connecting the first shaft to a first driving shaft of the first linear motion unit to provide linear motion;

a first displacement sensor adapted to measure a movement distance of the first driving shaft of the first linear motion unit; and a linear motion stop unit disposed in the vicinity of the first insulating joint to prevent the first shaft from being pulled by a difference between vacuum pressure and atmospheric pressure.

7. The linear motion module of claim 6, wherein the linear motion stop unit is a spring.

8. The linear motion module of claim 6, wherein the linear motion stop unit comprises:
   a protrusion inserted into a groove formed on an outer circumferential surface of the first insulating joint; and
   a driver axially coupled to the protrusion to move the protrusion.

9. An impedance matching device comprising:
   a first variable capacitor connected to an RF power source and including a first shaft moving linearly;
   a first linear motion unit axially coupled to the first shaft of the first variable capacitor to provide linear motion;
   a first insulating joint connecting the first shaft to a first driving shaft of the first linear motion unit;
   a first displacement sensor adapted to measure a movement distance of the first driving shaft of the first linear motion unit,
   a front-end flange coupled to a first electrode of the first variable capacitor;
   a back-end flange coupled to the first linear motion unit; and
   an insulating fixing part disposed to encircle the first insulating joint and having a first end coupled to the front-end flange and a second end coupled to the back-end flange,
   wherein the first linear motion unit comprises:
      a coil bobbin coupled to the other end of the first driving shaft; and
      a first permanent magnet unit disposed to encircle the first driving shaft and provide linear motion to the coil bobbin.

10. The impedance matching device of claim 1, further comprising:
   a second variable capacitor including a second shaft moving linearly;
   a second linear motion unit axially coupled to the second shaft of the second variable capacitor to provide linear motion;
   a second insulating joint connecting the second shaft to a second driving shaft of the second linear motion unit; and
   a second displacement sensor adapted to measure a movement distance of the second driving shaft of the second linear motion unit.

* * * * *